(12) United States Patent
Lee et al.

(10) Patent No.: US 8,562,842 B2
(45) Date of Patent: Oct. 22, 2013

(54) METHODS OF FABRICATING NANOIMPRINT STAMP

(75) Inventors: Du-hyun Lee, Suwon-si (KR); Byung-kyu Lee, Seoul (KR); Woong Ko, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 140 days.

(21) Appl. No.: 13/181,660

(22) Filed: Jul. 13, 2011

(65) Prior Publication Data

US 2012/0168404 A1   Jul. 5, 2012

(30) Foreign Application Priority Data

Jan. 5, 2011   (KR) .................. 10-2011-0001090

(51) Int. Cl.
*B44C 1/22*   (2006.01)
*C23F 1/02*   (2006.01)

(52) U.S. Cl.
USPC ................... 216/11; 216/40; 216/41; 216/44; 216/52; 216/53; 264/220; 425/403

(58) Field of Classification Search
CPC ........................................ C23F 1/02
USPC .................. 216/11, 40, 44, 52, 53; 264/220; 425/403

See application file for complete search history.

(56) References Cited

U.S. PATENT DOCUMENTS

| | | | |
|---|---|---|---|
| 5,772,905 A * | 6/1998 | Chou | 216/44 |
| 6,517,995 B1 | 2/2003 | Jacobson et al. | |
| 7,448,860 B2 * | 11/2008 | Wago et al. | 425/93 |
| 2007/0158872 A1* | 7/2007 | Jeong et al. | 264/220 |
| 2008/0261152 A1* | 10/2008 | Sugiyama | 430/296 |
| 2009/0087793 A1* | 4/2009 | Kim et al. | 430/320 |
| 2012/0052415 A1* | 3/2012 | Fragala et al. | 430/2 |

FOREIGN PATENT DOCUMENTS

| | | |
|---|---|---|
| JP | 2007088374 A | 4/2007 |
| JP | 2007136790 A | 6/2007 |
| KR | 102006012888 | 12/2006 |
| KR | 100897931 | 5/2009 |

\* cited by examiner

*Primary Examiner* — Shamim Ahmed
(74) *Attorney, Agent, or Firm* — Harness, Dickey & Pierce, P.L.C.

(57) ABSTRACT

A method of fabricating a nanoimprint stamp includes forming a resist pattern having a nano size width on a stamp substrate by performing imprint processes repeatedly. In the imprint processes, resist layers that are selectively etched are sequentially used. The stamp substrate is etched using the resist pattern as an etch mask.

18 Claims, 8 Drawing Sheets

METHODS OF FABRICATING NANOIMPRINT STAMP

CROSS-REFERENCE TO RELATED APPLICATIONS

This application claims priority under 35 U.S.C. §119 to Korean Patent Application No. 10-2011-0001090, filed on Jan. 5, 2011, in the Korean Intellectual Property Office (KIPO), the disclosure of which is incorporated herein in its entirety by reference.

BACKGROUND

1. Field

Example embodiments relate to methods of fabricating nanoimprint stamps with a fine structure.

2. Description of the Related Art

In a nano imprinting process, after forming a pattern having a desired shape on a surface of a stamp made of a hard material, the pattern is repeatedly copied by pressing the stamp on an object made of a relatively soft material.

Conventionally, photolithography or e-beam lithography is mainly used as a method of obtaining a high resolution and high density pattern. However, according to these methods, it is difficult to manufacture a pattern having a size of 20 nm or less since scattered photons or electrons affect regions outside an exposed region.

SUMMARY

Provided are methods of fabricating nanoimprint stamps by using a multi-patterning method including an implant process.

Additional aspects will be set forth in part in the description which follows and, in part, will be apparent from the description, or may be learned by practice of example embodiments.

In example embodiments, a method of fabricating a nanoimprint stamp may include forming a first resist layer on a stamp substrate, pressing an imprint stamp onto the first resist layer to form a first resist pattern, the imprint stamp including a first pattern that is transferred onto the first resist layer when the imprint stamp is pressed onto the first resist layer, forming a second resist layer on the first resist pattern, pressing the imprint stamp onto the second resist layer to form a second resist pattern, the imprint stamp transferring the first pattern onto second resist layer when the imprint stamp is pressed onto the second resist layer, forming a third resist pattern by etching the first resist pattern using the second resist pattern as an etch mask, and etching the stamp substrate using the third resist pattern as an etch mask.

In example embodiments, a method of fabricating a nanoimprint stamp may include forming a first resist layer on a stamp substrate, pressing a first imprint stamp having a first pattern onto the first resist layer to form a first resist pattern, the first pattern being transferred onto the first resist layer when the first imprint stamp is pressed onto the first resist layer, forming a second resist layer having a height substantially equal to that of the first resist pattern, pressing a second imprint stamp having a second pattern onto the second resist layer to form a second resist pattern, the second pattern being transferred onto the second resist layer when the second imprint stamp is pressed onto the second resist layer, the second pattern including a convex unit having a width narrower than that of a convex unit of the first pattern, forming a third resist pattern by selectively etching the first resist pattern, and etching the stamp substrate using the third resist pattern as an etch mask.

In example embodiments, a method of fabricating a nanoimprint stamp may include forming a first resist layer on a stamp substrate, pressing a first imprint stamp having a first pattern onto the first resist layer to form a first resist pattern, the first pattern being transferred onto the first resist layer when the first imprint stamp is pressed onto the first resist layer, forming a second resist layer covering the first resist pattern, pressing a second imprint stamp having a second pattern onto the second resist layer to form a second resist pattern, the second pattern being transferred onto the second resist layer when the second imprint stamp is pressed onto the second resist layer, the second pattern having a convex unit with a width greater than that of a convex unit of the first pattern, the convex unit of the second imprint stamp being formed to correspond to the convex unit of the first pattern, forming a third resist pattern by selectively etching the first resist pattern, and forming a third resist pattern on the stamp substrate by etching an entire surface of the third resist pattern.

In example embodiments, a method of fabricating a nanoimprint stamp may include forming a first resist layer on a stamp substrate, forming a first resist pattern by pressing a first imprint stamp onto the first resist layer, the imprint stamp having a first pattern including a plurality of convex units spaced at a first pattern width, forming a second resist layer on the second resist pattern, forming a second resist pattern by pressing one of the first imprint stamp and a second imprint stamp onto the second resist layer, the second imprint stamp having a second pattern including a plurality of convex units spaced at a second pattern width, forming an imprint stamp having a third pattern by etching the first and second resist patterns, the third pattern having a pattern width smaller than the first pattern width.

According to example embodiments, there is provided a method of fabricating a nanoimprint stamp. In example embodiments, the method includes forming a first resist layer on a stamp substrate, forming a first resist pattern by transferring a first pattern onto the first resist layer by performing an imprint process using an imprint stamp on which the first pattern is formed, forming a second resist layer covering the first resist pattern on the stamp substrate, forming a second resist pattern by transferring the first pattern onto the second resist layer by performing an nanoimprint process using the nanoimprint stamp, forming a third resist pattern by etching the first resist pattern using the second resist pattern as an etch mask, and etching the stamp substrate using the third resist pattern as an etch mask.

The first resist layer and the second resist layer may be formed of materials having different etch selectivity with respect to each other.

One of the first resist layer and the second resist layer may be formed of an acrylate group polymer or a urethane group polymer, and the other may be formed of an organic-inorganic polymer.

The organic-inorganic polymer may be an acrylate group polymer or a urethane group polymer that contains silicon.

The forming of the first resist pattern may include exposing an upper surface of the stamp substrate.

The forming of the second resist pattern may include aligning a convex unit of the first pattern to be placed over a convex unit of the first resist pattern.

The forming of the second resist pattern may include exposing an upper surface of the first resist pattern.

The forming of the third resist pattern may further include selectively etching the second resist pattern.

The method may further include repeatedly performing the forming of the second resist layer, the forming of the second resist pattern and the forming of the third resist pattern after performing the forming of the third resist pattern.

In example embodiments, a plurality of the forming of the second resist patterns may comprise forming a plurality of the first patterns on a corresponding resist layer with an equal distance.

In accordance with example embodiments, a method of fabricating a nanoimprint stamp is provided. In example embodiments, the method may include forming a first resist layer on a stamp substrate, forming a first resist pattern by transferring a first pattern onto the first resist layer by performing an imprint process using a first imprint stamp on which the first pattern is formed, forming a second resist layer having a height equal to that of the first resist pattern on the stamp substrate, forming a second resist pattern by transferring a second pattern onto the second resist layer by performing an imprint process using a second imprint stamp on which the second pattern having a convex unit having a width narrower than that of a convex unit of the first pattern is formed, forming a third resist pattern by selectively etching the first resist pattern, and etching the stamp substrate using the third resist pattern as an etch mask.

A pattern width of the second pattern may be substantially the same as a pattern width of the first pattern.

The forming of the second resist layer may further include forming the second resist layer covering the first resist pattern on the stamp substrate and exposing an upper surface of the first resist pattern by etching an entire surface of the second resist layer.

In accordance with example embodiments, there is provided a method of fabricating a nanoimprint stamp. In example embodiments, the method of fabricating the nanoimprint stamp may include forming a first resist layer on a stamp substrate, forming a first resist pattern by transferring a first pattern onto the first resist layer by performing an imprint process using a first imprint stamp on which the first pattern is formed, forming a second resist layer covering the first resist pattern on the stamp substrate, forming a second resist pattern by transferring a second pattern of a second imprint stamp onto the second resist layer by performing an imprint process using the second imprint stamp on which the second pattern having a convex unit having a width greater than that of a convex unit of the first pattern, the convex unit of the second imprint stamp being formed to correspond to the convex unit of the first pattern, forming a third resist pattern by selectively etching the first resist pattern, and transferring the third resist pattern onto the stamp substrate by etching an entire surface of the third resist pattern.

The forming of the second resist pattern may include pressing a convex unit of the second resist pattern to contact an upper surface of the first resist pattern.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
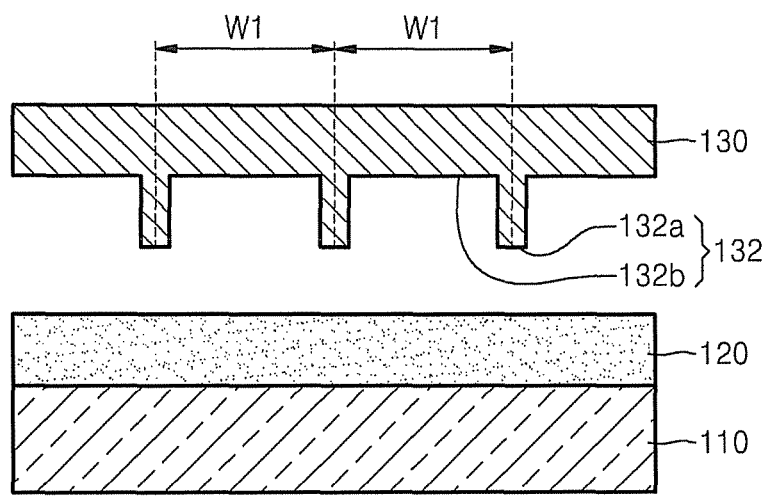
FIGS. 1A through 1H are schematic cross-sectional views sequentially showing a method of fabricating a nanoimprint stamp according to example embodiments.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments as illustrated in the accompanying drawings. In the drawings, the thicknesses of layers and regions are exaggerated for clarity and like reference numerals refer to the like elements throughout.

FIGS. 1A through 1H are schematic cross-sectional views sequentially showing a method of fabricating a nanoimprint stamp according to example embodiments.

Referring to FIG. 1A, a first resist layer 120 may be formed on a stamp substrate 110 for fabricating a nanoimprint stamp. The stamp substrate 110 may be formed of a hard material, for example, quartz or glass. The first resist layer 120 may be formed by spin coating an optical hardening resin or a thermal hardening resin. However, example embodiments are not limited spin coating as a method for forming the first resist layer 120.

In example embodiments, an imprint stamp 130 having a first pattern 132 is prepared. The first pattern 132 may include a convex unit 132a and a concave unit 132b. The imprint stamp 130 may be formed of glass or quartz, though example embodiments are not limited thereto. The imprint stamp 130 may be formed to have a pattern width W1 greater than a pattern width (for example, 20 nm) of a pattern to be formed on the stamp substrate 110. Therefore, the imprint stamp 130 may be formed by using a conventional e-beam lithography method, a laser interference lithography method, or an optical lithography method. The pattern width W1 of the first pattern 132 may be an integer multiple of a pattern width of a pattern to be formed on the stamp substrate 110.

Figure 1B:
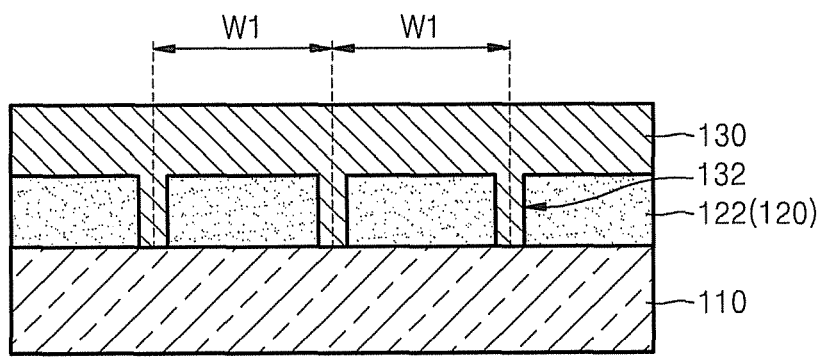

Referring to FIG. 1B, a first resist pattern 122 may be formed by transferring the first pattern 132 to the first resist layer 120 through an imprint process in which the imprint stamp 130 is pressed onto the first resist layer 120. According to the material used to form the first resist layer 120, the first resist layer 120 may be hardened by applying heat or irradiating ultraviolet rays to harden the polymer that constitutes the first resist layer 120.

Figure 1C:
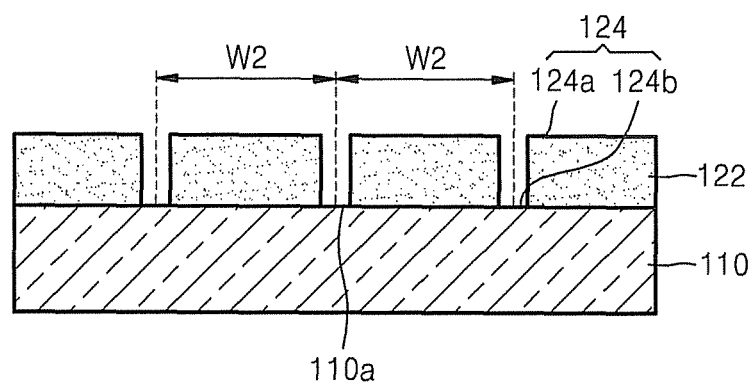

Referring to FIG. 1C, the imprint stamp 130 may be separated from the stamp substrate 110. Accordingly, a surface of the stamp substrate 110 may be exposed. If a portion of the first resist layer 120 remains on a first surface 110a of the stamp substrate 110 was contacted by the first pattern 132, the first surface 110a of the stamp substrate 110 may be exposed by etching the entire surface of the first resist pattern 122. The first resist pattern 122 has a second pattern (a concave pattern) 124 opposite to the first pattern 132. The second pattern 124 may have a convex unit 124a and a concave unit 124b, and may have a pattern width W2 the same as the pattern width W1 of the first pattern 132.

Figure 1D:
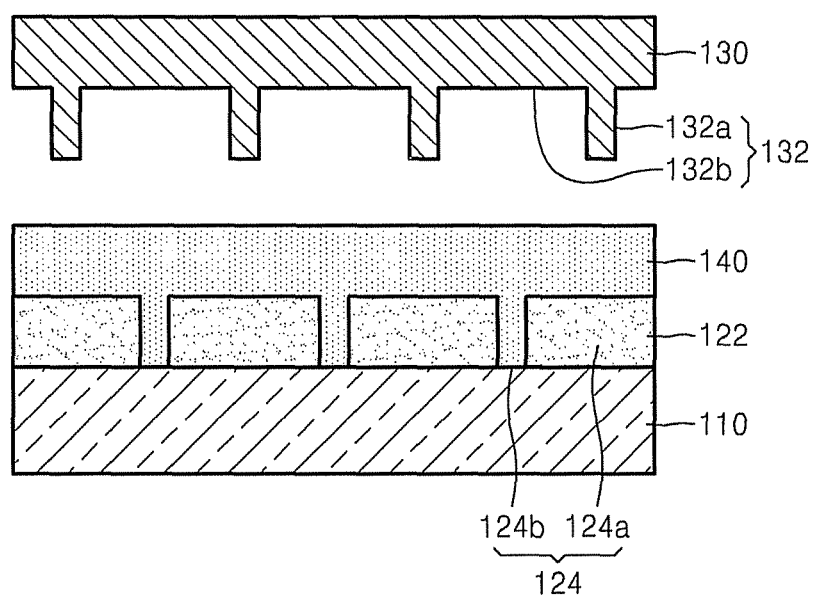

Referring to FIG. 1D, a second resist layer 140 covering the first resist pattern 122 may be formed on the stamp substrate 110 by using a coating method. The second resist layer 140 may be formed of a material having different etching characteristics from the first resist layer 120. For example, the first resist layer 120 may be formed of an organic group material, for example, an acrylate group polymer or a urethane group polymer, and the second resist layer 140 may be formed of an organic-inorganic polymer. The organic-inorganic polymer may be a urethane group polymer or an acrylate group polymer that contains silicon.

Alternatively, the first resist layer 120 may be formed of an organic-inorganic polymer, and the second resist layer 140 may be formed of an acrylate group polymer or a urethane group polymer. The convex unit 132a of the first pattern 132 of the imprint stamp 130 may be arranged to be placed above the convex unit 124a of the second pattern 124 of the first resist pattern 122 by laterally moving the imprint stamp 130 which was separated upward from the stamp substrate 110.

Figure 1E:
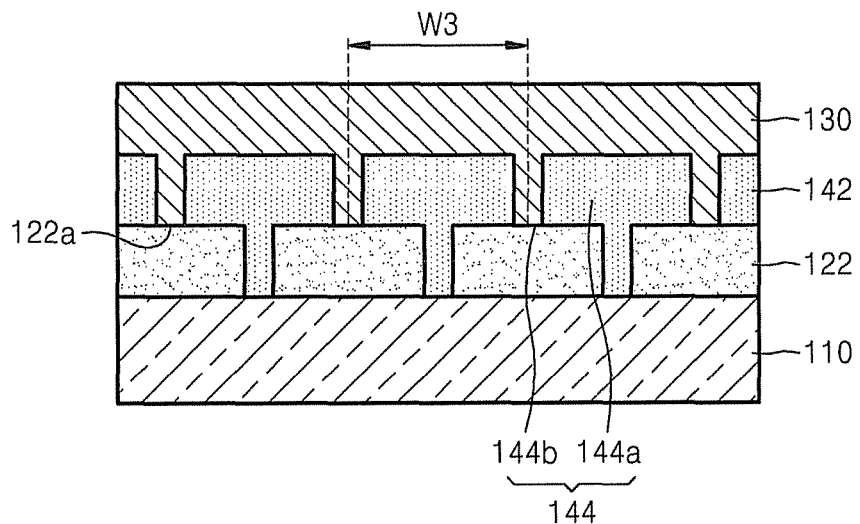

Referring to FIG. 1E, the first pattern 132 may be arranged to be placed on the center of the second pattern 124. Since this lateral moving is a fine movement, the fine movement and alignment method of a substrate in the conventional semiconductor process can be used. Afterwards, a second resist pattern 142 may be formed by performing a second imprint process as the same process described above. The second resist pattern 142 may have a third pattern 144 having a pattern width W3 equal to the pattern width W1 of the first pattern 132. The third pattern 144 may include a convex unit 144a and a concave unit 144b.

Figure 1F:
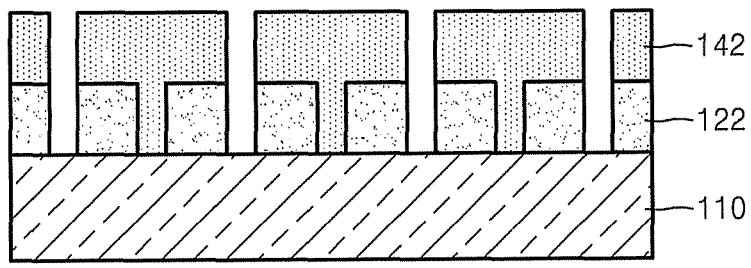

Referring to FIG. 1F, the imprint stamp 130 may be separated from the stamp substrate 110. When a portion of the second resist layer 140 remains on a second surface 122a of the first resist pattern 122 that was contacted by the convex unit 132a of the first pattern 132, the second surface 122a of the first resist pattern 122 may be exposed by etching the entire surface of second resist pattern 142.

An upper surface of the stamp substrate 110 may be exposed by selective etching the first resist pattern 122 exposed in the concave unit 144b of the third pattern 144 using the second resist pattern 142 as an etch mask. When the first resist pattern 122 is formed of an acrylate group polymer or a urethane group polymer, the first resist pattern 122 exposed through the second resist pattern 142 may be selectively etched by a dry strip method using oxygen plasma.

Figure 1G:
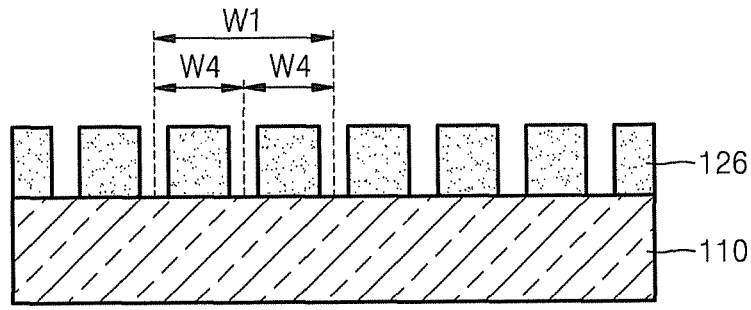

Referring to FIG. 1G, when the second resist pattern 142 is removed, a third resist pattern 126 remains on the stamp substrate 110. When the second resist pattern 142 is formed of an organic-inorganic polymer, the second resist pattern 142 may be selectively removed by dry etching using an etch gas that contains oxygen and fluoride. The third resist pattern 126 has a pattern width W4 smaller than the pattern width W1 of the first pattern 132. In FIG. 1G, the pattern width W4 is half the size of the pattern width W1.

Figure 1H:
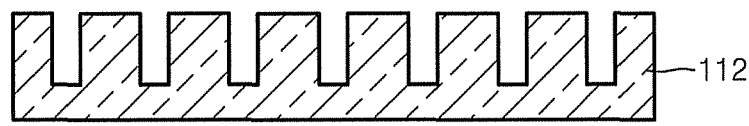

Referring to FIG. 1H, the stamp substrate 110 may be etched using the third resist pattern 126 as an etch mask, and the third resist pattern 126 may be removed using a conventional lift-off process. As a result a nanoimprint stamp 112 is formed by transferring the third resist pattern 126.

In example embodiments, a single imprint stamp 130 may be used twice. However, example embodiments are not limited thereto. For example, in FIG. 1G, after additionally forming a third resist layer using a material that can be etched selectively with the first resist layer 120 like the second resist layer 140, as described above, the third implant process may be repeated, and if the second implant process and the third implant process are performed with an equal distance with respect to the second pattern 124, the pattern width W1 can be reduced as many times as the number of nanoimprint processes. A nanoimprint stamp may be fabricated by transferring a resultant pattern on the stamp substrate 110 as described above.

According to the method of fabricating a nanoimprint stamp according to example embodiments, a pattern width can be reduced by an integer multiple by repeatedly using an imprint stamp having the pattern. Accordingly, a nanoimprint stamp having a nano-width of 20 nm or less may be readily fabricated by using an imprint stamp having a pattern width of 20 nm or above.

FIGS. 2A through 2G are schematic cross-sectional views sequentially showing a method of fabricating a nanoimprint stamp according to example embodiments.

Figure 2A:
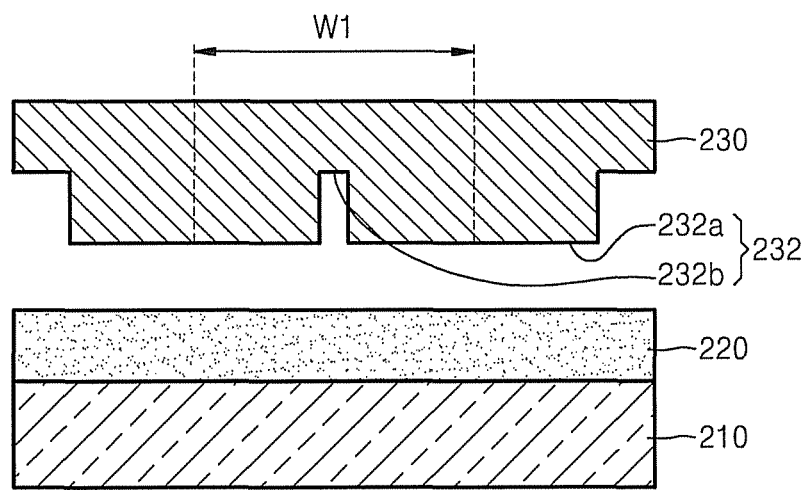
FIGS. 2A through 2G are schematic cross-sectional views sequentially showing a method of fabricating a nanoimprint stamp according to example embodiments.

Referring to FIG. 2A, a first resist layer 220 may be formed on a stamp substrate 210 for fabricating a nanoimprint stamp. The stamp substrate 210 may be formed of a hard material, for example, quartz or glass, though example embodiments are not limited thereto. The first resist layer 220 may be formed by spin coating an optical hardening resin or a thermal hardening resin. However, example embodiments are not limited spin coating as a method for forming the first resist layer 220.

In example embodiments, an imprint stamp 230 on which a first pattern 232 is formed may be prepared. The first pattern 232 may include a convex unit 232a and a concave unit 232b, and may have a pattern width W1. In example embodiments, the first pattern 232 may or may not be predetermined. The imprint stamp 230 may be formed to have a pattern width W1 greater than a pattern width (for example, 20 nm) of a pattern to be formed on the stamp substrate 210. Therefore, the imprint stamp 230 may be formed by using a conventional e-beam lithography method, a laser interference lithography method, or an optical lithography method. The pattern width W1 of the first pattern 232 may be an integer multiple of the pattern width of a pattern to be formed on the stamp substrate 210.

Figure 2B:
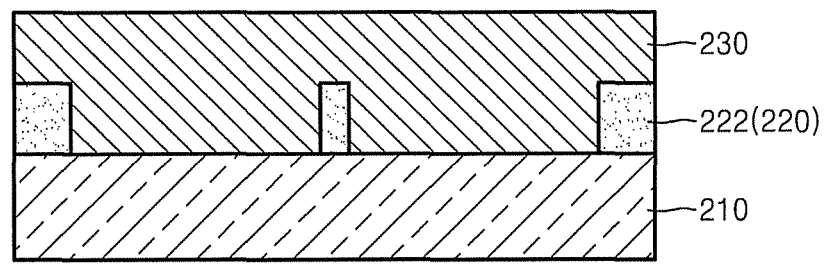

Referring to FIG. 2B, a first resist pattern 222 may be formed by transferring the first pattern 232 to the first resist layer 220 through an imprint process in which the imprint stamp 230 is pressed onto the first resist layer 220. According to the material used to form the first resist layer 220, the first resist layer 220 may be hardened by applying heat or irradiating ultraviolet rays to harden the polymer that constitutes the first resist layer 220.

Figure 2C:
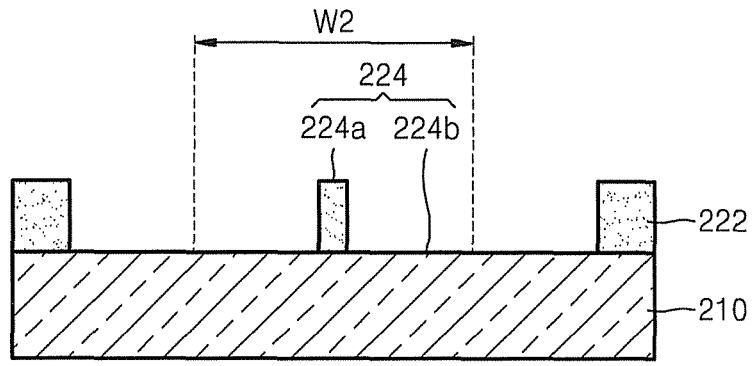

Referring to FIG. 2C, the imprint stamp 230 may be separated from the stamp substrate 210. Accordingly, the first resist pattern 222 may have a second pattern 224 opposite to the first pattern 232. The second pattern 224 includes a convex unit 224a and a concave unit 224b. The second pattern 224 has a pattern width W2 equal to the pattern width W1 of the first pattern 232.

Figure 2D:
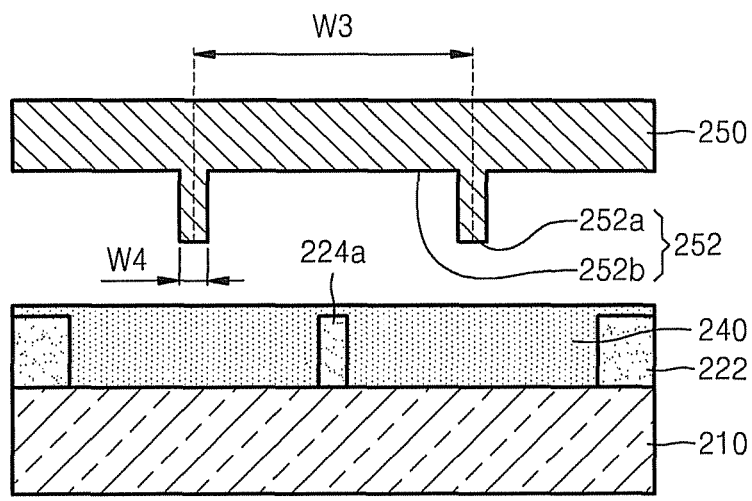

Referring to FIG. 2D, a second resist layer 240 covering the first resist pattern 222 may be formed on the stamp substrate 210 by using a spin coating method. The second resist layer 240 may be formed to have the same height as the first resist pattern 222 or may be formed to be higher than the first resist pattern 222 as shown in FIG. 2D so as to slightly cover the convex unit 224a of the first resist pattern 222. The second resist layer 240 may be formed of a material having different etching characteristics from the first resist layer 220. For example, the second resist layer 220 may be formed of an organic group material, for example, an acrylate group polymer or a urethane group polymer, and the second resist layer 240 may be formed of an organic-inorganic polymer. The organic-inorganic polymer may be an acrylate group polymer or a urethane group polymer that contains silicon.

Alternatively, the first resist layer 220 may be formed of an organic-inorganic polymer, and the second resist layer 240 may be formed of an acrylate group polymer or a urethane group polymer.

A portion of the second resist layer 240 higher than the first resist pattern 222 may be is removed by etching an entire surface of the second resist layer 240 from above the second resist layer 240.

Another imprint stamp 250 for performing an imprint process onto the second resist layer 240 may be prepared. The imprint stamp 250 may include a third pattern 252 having a pattern width W3 as the same as the pattern width W1 of the first pattern 232 on a surface thereof. The third pattern 252 may include a convex unit 252a and a concave unit 252b. The convex unit 252a of the third pattern 252 may have a width W4 smaller than the pattern width W1 of the first pattern 232.

Figure 2E:
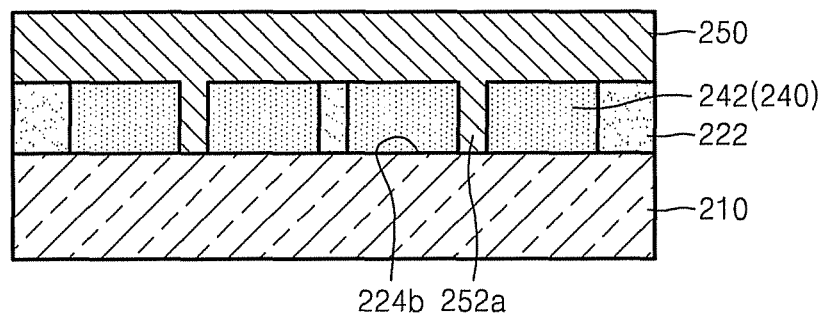

Referring to FIG. 2E, the convex unit 252a of the third pattern 252 of the imprint stamp 250 may be placed in the middle of the concave unit 224b of the second pattern 224 of the first resist pattern 222 (refer to FIG. 2D). Afterwards, by performing the same process described above, a second resist pattern 242 may be formed. The second resist pattern 242 may be formed on the same layer with the first resist pattern 222.

Figure 2F:
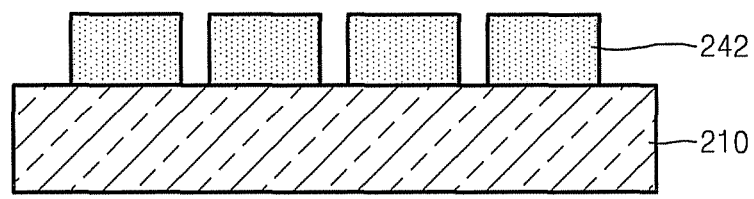

Referring to FIG. 2F, after separating the imprint stamp 250 from the stamp substrate 210, an upper surface of the stamp substrate 210 may be exposed by selectively etching the first resist pattern 222. The second resist pattern 242 may remain on the stamp substrate 210.

Figure 2G:
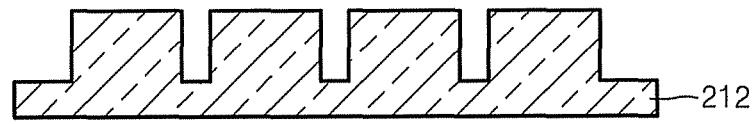

Referring to FIG. 2G, the stamp substrate 210 may be etched using the second resist pattern 242 as an etch mask, and the second resist pattern 242 may be removed using a conventional lift-off process. A nanoimprint stamp 212 as a resultant product is a stamp onto which the second resist pattern 242 is transferred.

According to example embodiments, a nanoimprint stamp having a nano-width can be readily fabricated by sequentially using two implant stamps having patterns different from each other.

FIGS. 3A through 3G are schematic cross-sectional views sequentially showing a method of fabricating a nanoimprint stamp according to example embodiments.

Figure 3A:
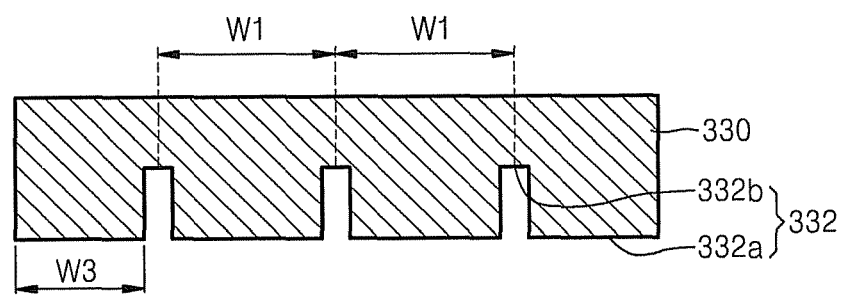
FIGS. 3A through 3G are schematic cross-sectional views sequentially showing a method of fabricating a nanoimprint stamp according to example embodiments.
Figure 3A:
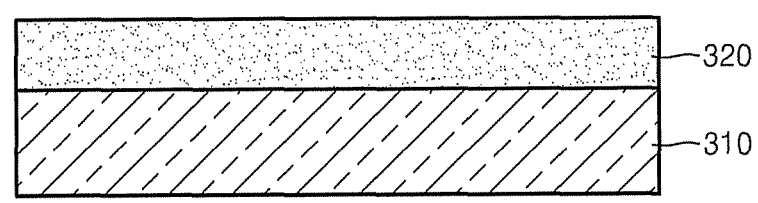

Referring to FIG. 3A, a first resist layer 320 may be formed on a stamp substrate 310 for fabricating a nanoimprint stamp. The stamp substrate 310 may be formed of a hard material, for example, quartz or glass. The first resist layer 320 may be formed by spin coating an optical hardening resin or a thermal hardening resin.

In example embodiments, an imprint stamp 330 on which a first pattern 332 may be formed is prepared. The first pattern 332 may include a convex unit 332a and a concave unit 332b, and may have a pattern width W1. In example embodiments, the first pattern 332 may or may not be predetermined. The imprint stamp 330 may be formed of quartz or glass, and may be formed to have the pattern width W1 greater than a pattern width (for example, 20 nm) of a pattern to be formed on the stamp substrate 310. Therefore, the imprint stamp 330 may be formed by using a conventional e-beam lithography method, a laser interference lithography method, or an optical lithography method. The pattern width W1 of the first pattern 332 may be an integer multiple of the pattern width of a pattern to be formed on the stamp substrate 310.

Figure 3B:
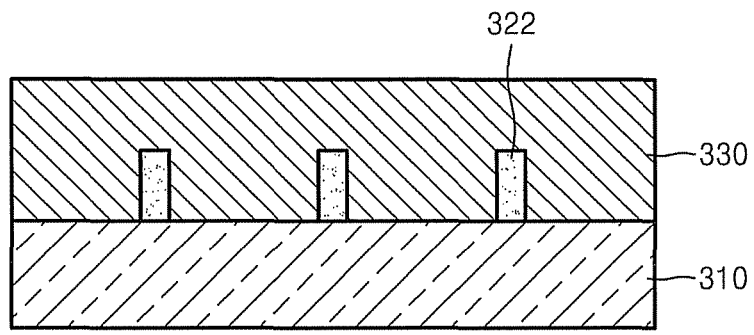

Referring to FIG. 3B, a first resist pattern 322 may be formed by transferring the first pattern 332 to the first resist layer 320 through an imprint process in which the imprint stamp 330 is pressed onto the first resist layer 320. According to the material used to form the first resist layer 320, the first resist layer 320 may be hardened by applying heat or irradiating ultraviolet rays to harden the polymer that constitutes the first resist layer 320.

Figure 3C:
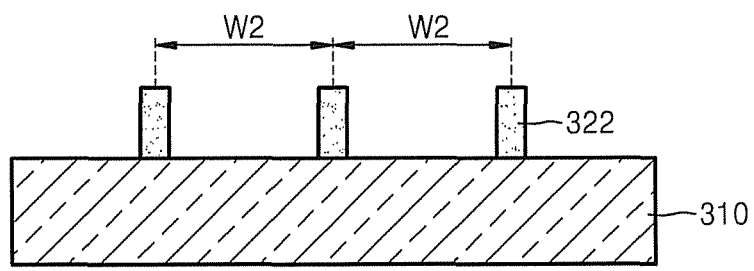

Referring to FIG. 3C, the imprint stamp 330 may be separated from the stamp substrate 310. Accordingly, the first resist pattern 322 may have a second pattern (convex pattern) 324 opposite to the first pattern 332. The second pattern 324 may have a pattern width W2 equal to the pattern width W1 of the first pattern 332.

Figure 3D:
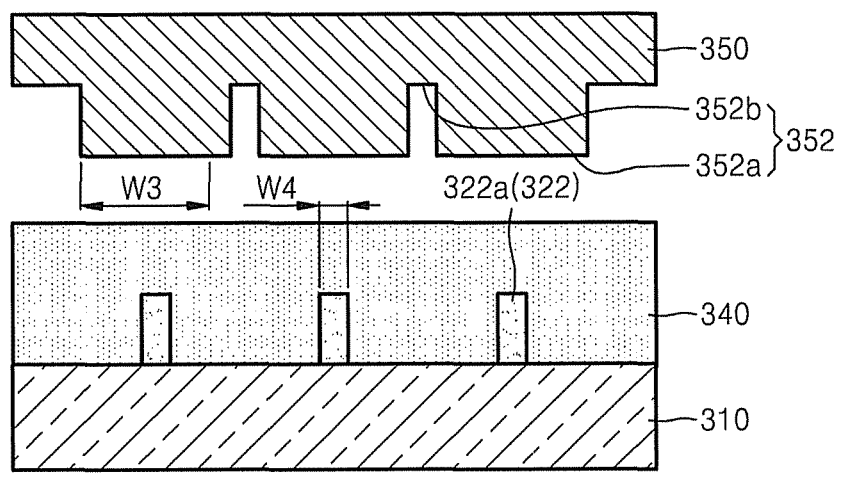

Referring to FIG. 3D, a second resist layer 340 covering the first resist pattern 322 may be formed on the stamp substrate 310 by using a spin coating method. The second resist layer 340 may be formed of a material having different etching characteristics from the first resist layer 320. For example, the first resist layer 320 may be formed of an organic group material, for example, an acrylate group polymer or a urethane group polymer, and the second resist layer 340 may be formed of an organic-inorganic polymer. The organic-inorganic polymer may be an acrylate group polymer or a urethane group polymer that contains silicon.

Alternatively, the first resist layer 320 may be formed of an organic-inorganic polymer, and the second resist layer 340 may be formed of an acrylate group polymer or a urethane group polymer.

An imprint process may be performed by moving another imprint stamp 350 above the second resist layer 340. The implant stamp 350 may include a second pattern 352 on a lower surface thereof. The second pattern 352 may include a convex unit 352a and a concave unit 352b. The convex unit 352a of the second pattern 352 may be formed to correspond to a convex unit 322a of the first resist pattern 322. The convex unit 352a of the second pattern 352 may have a width W3 greater than a width W4 of the convex unit 322a of the first resist pattern 322. The convex unit 352a of the second pattern 352 of the imprint stamp 350 may be aligned above the convex unit 322a of the first resist pattern 322.

Figure 3E:
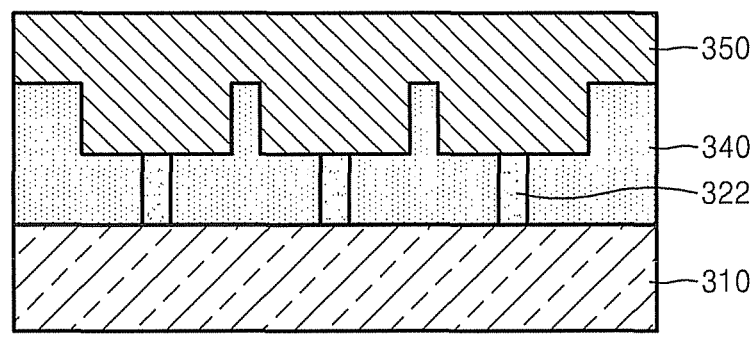

Referring to FIG. 3E, the imprint stamp 350 may be pressed onto the second resist layer 340 until the convex unit 352a of the second pattern 352 contacts an upper surface of the convex unit 322a of the first resist pattern 322. Next, an implant process described above is performed.

Figure 3F:
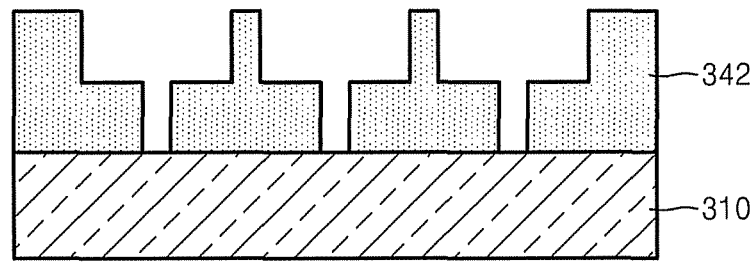

Referring to FIG. 3F, the imprint stamp 350 may be separated from the stamp substrate 310. An upper surface of the first resist pattern 322 may be exposed. The exposed first resist pattern 322 may be removed by selectively etching the first resist pattern 322. As a result, a second resist pattern 342 formed of the second resist layer 340 may remain on the stamp substrate 310. The second resist pattern 342 may have a three-dimensional shape.

Figure 3G:
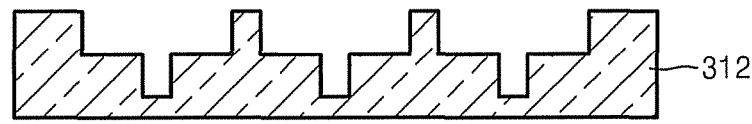

Referring to FIG. 3G, the second resist pattern 342 may be transferred onto the stamp substrate 310 when the second resist pattern 342 and the stamp substrate 310 are etched at a rate from above the second resist pattern 342. In example embodiments, the rate may or may not be predetermined. A resultant pattern having a three-dimensional shape on the stamp substrate 310 may have a contracted or expanded dimension to the second resist pattern 342 in a vertical direction with respect to the stamp substrate 310 according to the etch rate of the second resist layer 340 and the stamp substrate 310.

According to example embodiments, after primarily forming a three dimensional pattern on a stamp substrate sequentially using two imprint stamps having patterns different from each other, the shape of the three-dimensional pattern may be transferred onto the stamp substrate by etching an entire surface of the three-dimensional pattern. In this way, a nanoimprint stamp on which a complicated nano-scale pattern is formed can be readily formed by using the transferring method described above.

While the present invention has been particularly shown and described with reference to example embodiments, it will be understood by those of ordinary skill in the art that various changes in form and details may be made therein without departing from the spirit and scope of the present invention as defined by the following claims.

What is claimed is:

1. A method of fabricating a nanoimprint stamp, the method comprising:
    forming a first resist layer on a stamp substrate;
    pressing an imprint stamp onto the first resist layer to form a first resist pattern, the imprint stamp including a first pattern that is transferred onto the first resist layer when the imprint stamp is pressed onto the first resist layer;
    forming a second resist layer on the first resist pattern, the second resist layer formed of materials having etch selectivity with respect to the first resist layer;
    pressing the imprint stamp onto the second resist layer to form a second resist pattern, the imprint stamp transferring the first pattern onto second resist layer when the imprint stamp is pressed onto the second resist layer;
    forming a third resist pattern by etching the first resist pattern using the second resist pattern as an etch mask and by removing the second resist pattern from the first resist pattern; and
    etching the stamp substrate using the third resist pattern as an etch mask.

2. The method of claim 1, wherein one of the first resist layer or the second resist layer is formed of one of an acrylate group polymer or a urethane group polymer, and the other is formed of an organic-inorganic polymer.

3. The method of claim 2, wherein the organic-inorganic polymer is one of an acrylate group polymer or a urethane group polymer that contains silicon.

4. The method of claim 1, wherein forming the first resist pattern includes exposing an upper surface of the stamp substrate.

5. The method of claim 1, wherein forming the second resist pattern includes aligning a convex section of the first pattern over a convex section of the first resist pattern.

6. The method of claim 5, wherein forming the second resist pattern includes exposing an upper surface of the first resist pattern.

7. The method of claim 1, further comprising:
    repeatedly performing the forming of the second resist layer, the forming of the second resist pattern, and the forming of the third resist pattern after performing the forming of the third resist pattern.

8. The method of claim 7, wherein a plurality of the forming of the second resist patterns comprise forming a plurality of the first patterns on a corresponding resist layer with substantially an equal distance.

9. A method of fabricating a nanoimprint stamp, the method comprising:
   forming a first resist layer on a stamp substrate;
   pressing a first imprint stamp having a first pattern onto the first resist layer to form a first resist pattern, the first pattern being transferred onto the first resist layer when the first imprint stamp is pressed onto the first resist layer;
   forming a second resist layer having a height substantially equal to that of the first resist pattern;
   pressing a second imprint stamp having a second pattern onto the second resist layer to form a second resist pattern, the second pattern being transferred onto the second resist layer when the second imprint stamp is pressed onto the second resist layer, the second pattern including a convex section having a width narrower than that of a convex section of the first pattern;
   forming a third resist pattern by removing the first resist pattern from the second resist pattern; and
   etching the stamp substrate using the third resist pattern as an etch mask.

10. The method of claim 9, wherein a pattern width of the second pattern is substantially the same as a pattern width of the first pattern.

11. The method of claim 9, wherein one of the first resist layer or the second resist layer is formed of one of an acrylate group polymer or a urethane group polymer, and the other is formed of an organic-inorganic polymer.

12. The method of claim 11, wherein forming the first resist pattern comprises exposing the stamp substrate.

13. The method of claim 12, wherein forming the second resist layer further includes
   forming the second resist layer covering the first resist pattern on the stamp substrate, and
   exposing an upper surface of the first resist pattern by etching an entire surface of the second resist layer.

14. The method of claim 13, wherein forming the second resist pattern includes exposing an upper surface of the stamp substrate.

15. The method of claim 9, wherein forming the second resist pattern includes aligning the convex section of the second pattern above a center of the convex section of the first resist pattern.

16. A method of fabricating a nanoimprint stamp, the method comprising:
   forming a first resist layer on a stamp substrate;
   pressing a first imprint stamp having a first pattern onto the first resist layer to form a first resist pattern, the first pattern being transferred onto the first resist layer when the first imprint stamp is pressed onto the first resist layer;
   forming a second resist layer covering the first resist pattern;
   pressing a second imprint stamp having a second pattern onto the second resist layer to form a second resist pattern, the second pattern being transferred onto the second resist layer when the second imprint stamp is pressed onto the second resist layer, the second pattern having a convex section with a width greater than that of a convex section of the first pattern, the convex section of the second imprint stamp being formed to correspond to the convex section of the first pattern;
   forming a third resist pattern by removing the first resist pattern from the second resist pattern; and
   forming a pattern on the stamp substrate by etching an entire surface of the third resist pattern.

17. The method of claim 16, wherein one of the first resist layer or the second resist layer is formed of one of an acrylate group polymer or a urethane group polymer, and the other is formed of an organic-inorganic polymer.

18. The method of claim 16, wherein forming the second resist pattern includes pressing a convex section of the second resist pattern to contact an upper surface of the first resist pattern.

* * * * *